United States Patent
Ma

(10) Patent No.: US 6,486,668 B1
(45) Date of Patent: Nov. 26, 2002

(54) PREPARATORY PULSE SEQUENCE FOR SUPPRESSION OF ARTIFACTS IN MR IMAGES

(75) Inventor: Jingfei Ma, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 46 days.

(21) Appl. No.: 09/716,932

(22) Filed: Nov. 20, 2000

(51) Int. Cl.$^7$ ............................................. G01V 3/00
(52) U.S. Cl. ................................................ 324/307
(58) Field of Search .............................. 324/307, 309, 324/306

(56) References Cited

U.S. PATENT DOCUMENTS 4,715,383 A    12/1987   Ehman et al. ............... 128/653
5,657,757 A  * 8/1997    Hurd et al. ................. 324/307
6,078,175 A  * 6/2000    Foo ............................ 324/300
6,127,824 A  * 10/2000   Smith et al. ................ 324/300
6,310,479 B1 * 10/2001   Zhu et al. ................... 324/312

* cited by examiner

Primary Examiner—Edward Lefkowitz
Assistant Examiner—Dixomara Vargas
(74) Attorney, Agent, or Firm—Quarles & Brady LLP

(57) ABSTRACT

Image artifacts produced by NMR signals emanating from outside the designed spherical volume in an MRI system are suppressed by interleaving preparatory pulse sequences with image pulse sequences performed during a scan. Each preparatory pulse sequence includes a pair of RF pulses having equal, but opposite flip angles. Spins in the image field of view are tipped and then restored by the pair of RF pulses and spins outside the designed spherical volume are saturated.

16 Claims, 2 Drawing Sheets

PREPARATORY PULSE SEQUENCE FOR SUPPRESSION OF ARTIFACTS IN MR IMAGES

BACKGROUND OF THE INVENTION

The field of the invention is nuclear magnetic resonance imaging methods and systems. More particularly, the invention relates to the reduction of image artifacts caused by signals produced outside the field of view.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

To accurately excite spins and resolve the locations of the resulting NMR signals the polarizing magnetic field $B_0$ must be highly homogeneous and the imaging gradient fields $G_x$, $G_y$ and $G_z$ must be highly linear. Numerous structures and methods are known in the art to accomplish this in commercial MRI system, and the region where these fields meet the requirements is referred to as the designed spherical volume ("DSV"). The DSV may range for example, from a diameter of 40 to 48 cm. Outside the DSV, the polarizing magnetic field $B_0$ can become very inhomogeneous and the imaging gradients $G_x$, $G_y$ and $G_z$ can become highly nonlinear. They are also very poorly controlled in these outer regions.

Referring particularly to FIG. 2, the DSV of a typical MRI system is indicated by dashed line 10 and a subject to be scanned 12 is placed in the DSV 10. A field of view (FOV) from which accurate NMR data is acquired to reconstruct an image is indicated by dotted lines 14. Portions of the subject 12 are outside the DSV 10, and the spins therein are subject to the RF excitation fields and magnetic fields produced by the MRI system while imaging the FOV 14. The NMR signals produced by spins located outside the DSV 10 can produce image artifacts. These image artifacts from outside the DSV 10 can be aliased into the reconstructed image because of the limited imaging FOV 14, and they can be ghosted into the image because of the data inconsistency.

Methods and apparatus are known to reduce these artifacts. One solution is to increase the imaging FOV 14 to reduce aliasing. Hardware solutions include design of gradient coils with a larger linear region or RF transmit coils which significantly reduce RF excitation of spins outside the DSV 10. These are costly solutions which require major system changes.

SUMMARY OF THE INVENTION

The present invention is a method and apparatus for reducing image artifacts caused by signals emanating from outside the system DSV. More particularly, the imaging pulse sequence performed by the MRI system is preceeded by a preparatory pulse sequence which excites spins in the regions outside the DSV and spoils the resulting NMR signals. The imaging pulse sequence follows the preparatory pulse sequence before the longitudinal magnetization of spins outside the DSV have time to recover.

Since the RF and magnetic fields outside the DSV produce unpredictable results, it has been discovered that the use of conventional spatial presaturation pulse sequences do not suppress the image artifacts. The present invention solves this problem by applying a first RF pulse that is selective to the FOV along one gradient axis, applying a second RF pulse having an equal, but opposite flip angle and that is selective to the FOV along another gradient axis, and spoiling the NMR signals produced by the two RF pulses. Spin longitudinal magnetization in the FOV is restored by the application of the two equal but opposite flip angle RF pulses and spin longitudinal magnetization outside the FOV and along the two gradient axes is suppressed.

DESCRIPTION OF THE PREFERRED EMBODIMENT

Figure 1:
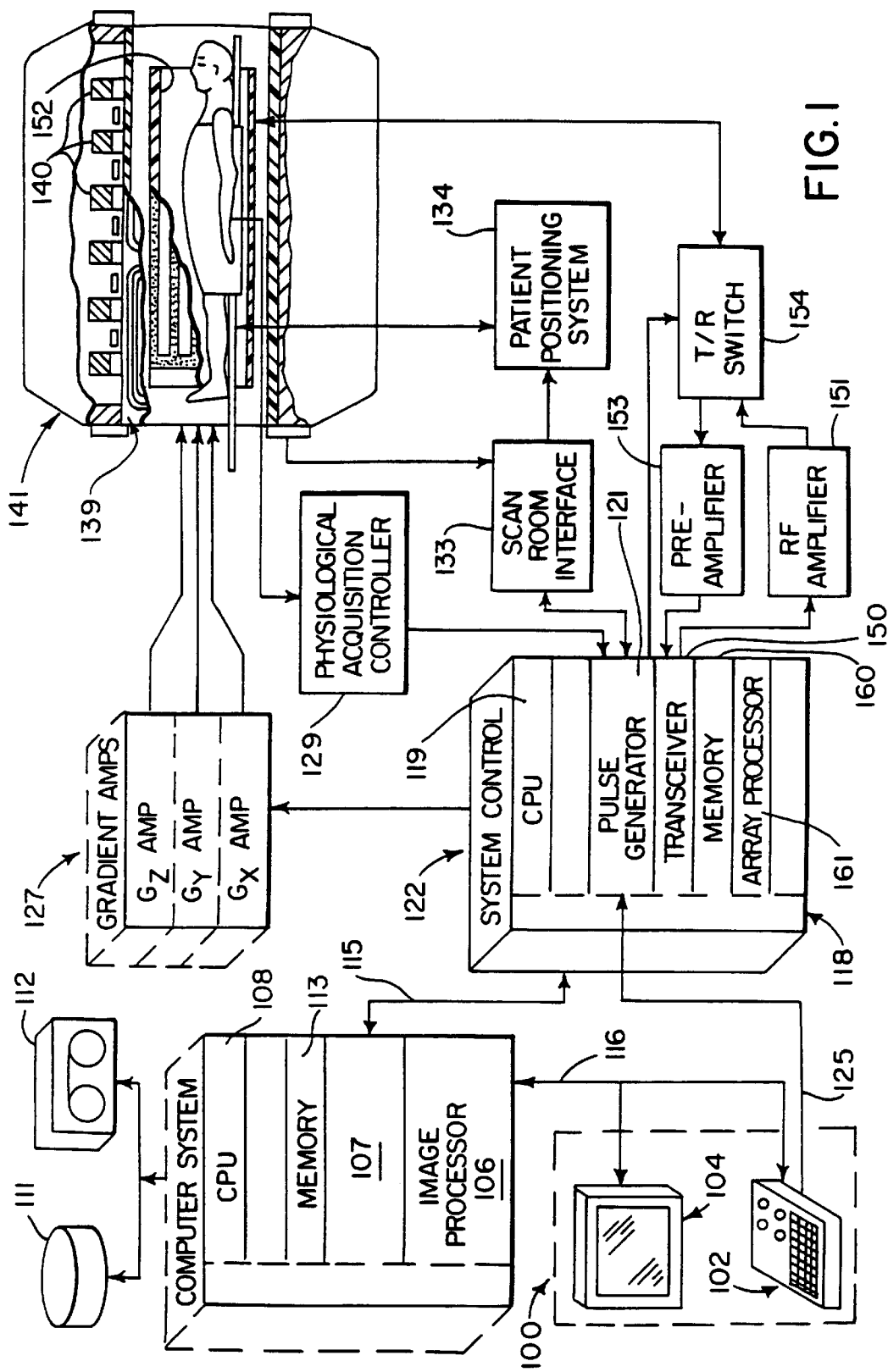
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
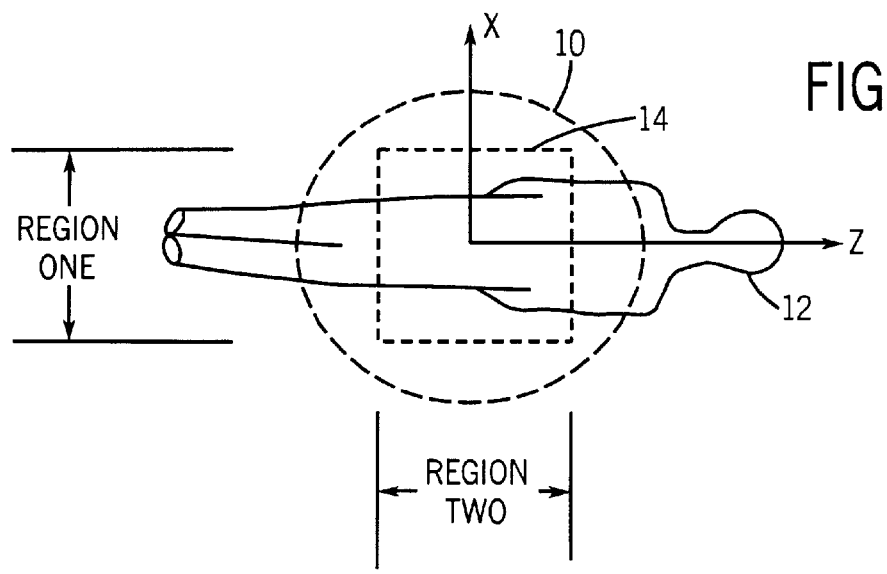
FIG. 2 is a schematic representation of the DSV, FOV and saturation regions produced by the MRI system when practicing the preferred embodiment of the invention.

To acquire an image, the MRI system performs a series of pulse sequences under the direction of the pulse generator 121. There are many imaging pulse sequences known in the art and the present invention may be used with any of them. The prescribed imaging pulse sequence directs the operation of the transceiver 150 to produce RF pulses and receive resulting NMR signals, and it directs the gradient system 127 to produce the required gradient fields $G_x$, $G_y$ and $G_z$. As shown in FIG. 2, the prescribed imaging pulse sequence directs the acquisition of NMR data that will enable an image of the FOV 14 to be reconstructed. The size, shape and orientation of the FOV 14 is determined by the scan parameters of the particular prescribed imaging pulse sequence used during the scan.

Figure 3:
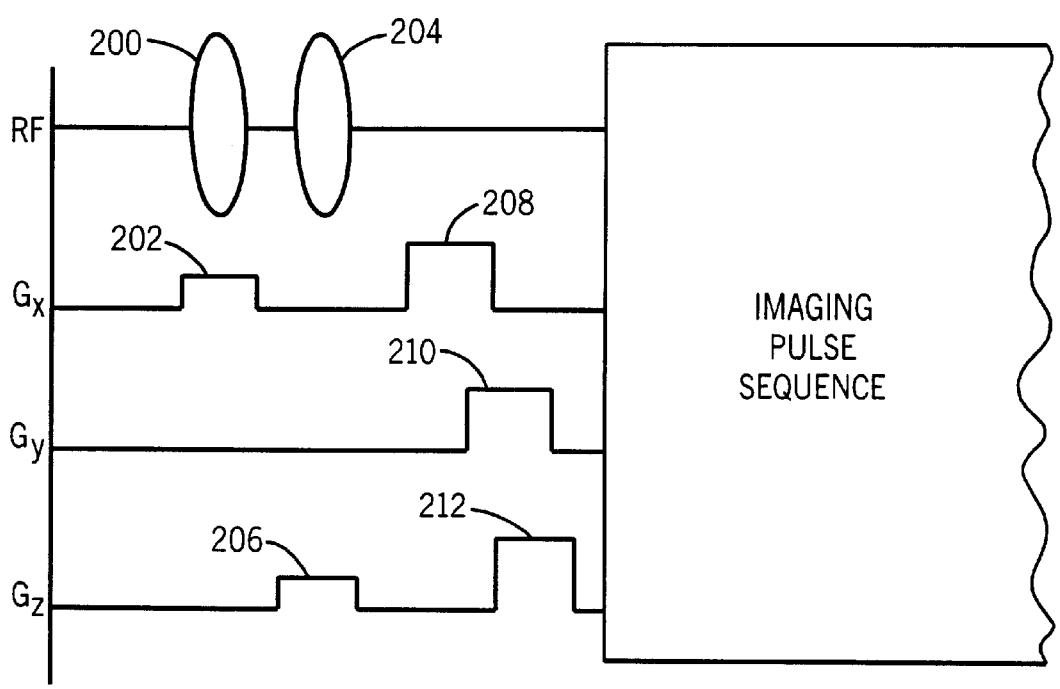
FIG. 3 is a graphic representation of a preparatory pulse sequence which employs the preferred embodiment of the invention.

Referring particularly to FIG. 3, the present invention employs a preparatory pulse sequence that is performed by the MRI system prior to the prescribed imaging pulse sequence. This preparatory pulse sequence may be repeated prior to each imaging pulse sequence in the series of imaging pulse sequences performed during the scan, or it may be interleaved between groups of imaging pulse sequences. The repetition rate of the preparatory pulse sequence will depend on such factors as the particular imaging pulse sequence used and the severity of the image artifacts to be suppressed.

Referring particularly to FIGS. 2 and 3, the preparatory pulse sequence begins with application of a selective RF pulse 200 having a flip angle $\alpha$ in the presence of a slab select $G_x$ gradient 202. The slab select $G_x$ gradient 202 has a strength sufficient to excite a slab of spins in the Y-Z plane having a "region one" thickness indicated in FIG. 2 of substantially the same extent of the FOV 14 along the x-axis. As a result, spins in the subject which are located in this slab along the Y and Z axes are saturated.

The next step is the application of a second RF pulse 204 in the presence of a slab select $G_z$ gradient 206. The second RF pulse 204 has the same flip angle $\alpha$, but the phase of the RF is reversed by 180° such that spins subjected to both RF pulses 200 and 204 are substantially unaffected. The slab select $G_z$ gradient 206 has a strength sufficient to excite a slab of spins in the X-Y plane having a "region two" thickness indicated in FIG. 2 of substantially the same extent as the FOV 14 along the z-axis. Spins in the subject disposed in this slab along the X and Y axes are excited. The first and second regions intersect, and the region of intersection is substantially coincident with the FOV 14. Those spins outside the FOV 14 along the x-axis are saturated, and those spins inside the region of overlap (i.e. the FOV 14) are restored to their original longitudinal magnetization.

Before performing an imaging pulse sequence the transverse magnetization produced by the RF pulses 200 and 204 is dephased, or "spoiled". This can be accomplished simply by a short delay before beginning the imaging pulse sequence (if the $B_0$ field inhomogeneities are significant outside the DSV 10), but in the preferred embodiment dephasing is accelerated by the application of spoiler gradients 208, 210 and 212 along respective gradient axes x, y and z. As a result, spins outside the FOV 14 are substantially saturated and their transverse magnetization is dephased such that no net NMR signal is detected.

It can be appreciated that a number of variations are possible without departing from the spirit of the invention. The preferred preparatory pulse sequence suppresses spin longitudinal magnetization located outside the FOV 14 along both the x and z-axes. If the subject 12 does not extend outside the FOV 14 along the x-axis, the first RF pulse 200 need not be selective and the slab select $G_x$ gradient pulse 202 need not be produced. In this alternative all spins in the bore of the MRI system are saturated by the first RF pulse 200 and a slab of spins in region two are restored by the second RF pulse 204. In the preferred embodiment the overlapping part of region one and region two slabs are coextensive with the prescribed boundaries of the FOV 14, but this is not a requirement. The regions one and two may define an intersecting volume which is larger than the FOV 14, but this volume should not extend beyond the boundary of the DSV 10, at least along those axes in which the subject extends beyond the DSV 10.

It is also possible to achieve fat suppression in the FOV 14 using the preparatory pulse sequence. This is achieved by controlling the time delay between the first and second RF pulses 200 and 204. If this time period is such that fat spins are allowed to dephase 180° with respect to water spins, the longitudinal magnetization of fat spins will not be restored by the second RF pulse 204. Rather, they will be tipped $2\alpha$ and spoiled by the subsequent gradients.

It is also possible to use other combinations of Rf pulse excitations during the preparatory pulse sequence. For example, other "binomial" excitations such as 1, −2, 2, −1 RF pulses may be used, where the numbers designate the relative flip angles of the RF pulses.

What is claimed is:

1. A method for reducing image artifacts produced by spins located outside the designed spherical volume (DSV) of a magnetic resonance imaging (MRI) system, the steps comprising:
   a) interleaving preparatory pulse sequences among a series of imaging pulse sequences to suppress the longitudinal magnetization of spins located outside the DSV, each preparatory pulse sequence including:
      i) producing a first selective RF pulse having a flip angle that suppresses longitudinal magnetization in spins located in a first region which includes the FOV; and
      ii) producing a second selective RF pulse that has a flip angle which restores the longitudinal magnetization in spins located in the FOV.

2. The method as recited in claim 1 in which each preparatory pulse sequence includes:
   iii) producing a slab select gradient concurrently with the second RF pulse.

3. The method as recited in claim 2 in which each preparatory pulse sequence includes:
   iv) producing a slab select gradient concurrently with the first RF pulse that is perpendicular to the slab select gradient produced in step iii).

4. The method as recited in claim 3 in which the first and second RF pulses excite spins located in two intersecting regions and the intersection of the two regions is substantially coincident with the prescribed FOV.

5. The method as recited in claim 1 in which the preparatory pulse sequence is performed prior to each imaging pulse sequence in the series.

6. The method as recited in claim 1 in which each preparatory pulse sequence includes:
   producing a spoiler gradient after the two RF pulses are produced.

7. The method as recited in claim 6 in which the spoiler gradient is produced by producing gradient fields along each of three orthogonal gradient axes.

8. The method as recited in claim 4 in which each preparatory pulse sequence includes:
   producing a spoiler gradient after the two RF pulses are produced to dephase spin transverse magnetization produced by the two RF pulses.

9. The method as recited in claim 8 in which the spoiler gradient is produced by producing gradient fields along each of three orthogonal gradient axes.

10. A method for reducing image artifacts produced by spins located outside the designed spherical volume (DSV) of a magnetic resonance imaging (MRI) system, the steps comprising:
    a) acquiring an image with the MRI system by performing a series of imaging pulse sequences that acquire NMR signals from spins in a prescribed field of view (FOV) located within the DSV;
    b) interleaving preparatory pulse sequences among the series of imaging pulse sequences to suppress the longitudinal magnetization of spins located outside the DSV, each preparatory pulse sequence including:
       i) producing a first RF pulse having a flip angle that excites spins in a first region which includes the FOV; and
       ii) producing a second RF pulse that has a flip angle which excites spins in a second region that intersects the first region, such that the intersection of the first and second regions includes the FOV and the spin magnetization in the FOV is restored by the second RF pulse; and
       iii) producing a first slab select gradient concurrently with the production of the first RF pulse; and
       iv) producing a second slab select gradient perpendicular to the first slab select gradient and concurrently with the production of the second RF pulse;
    wherein the first RF pulse is a selective pulse and the first region is a slab disposed in a plane perpendicular to the gradient axis of the first slab select gradient; and
    the second RF pulse is a selective pulse and the second region is a slab disposed in a plane perpendicular to the plane of the first region.

11. The method as recited in claim 10 in which the preparatory pulse sequence is performed prior to each imaging pulse sequence in the series.

12. The method as recited in claim 10 in which each preparatory pulse sequence includes:
    producing a spoiler gradient after the two RF pulses are produced to dephase transverse magnetization produced by the two RF pulses.

13. The method as recited in claim 12 in which the spoiler gradient is produced by producing gradient fields along each of three orthogonal gradient axes.

14. The method as recited in claim 10 which each preparatory pulse sequence includes:
    producing a spoiler gradient after the two RF pulses are produced to dephase transverse magnetization.

15. The method as recited in claim 14 in which the spoiler gradient is produced by producing gradient fields along each of three orthogonal gradient axes.

16. The method as recited in claim 10 in which production of the second RF pulse is timed to allow fat spin magnetization to become out of phase with water spin magnetization and the fat spin magnetization is not restored by the second RF pulse.

* * * * *